United States Patent [19]
Hasegawa

[11] Patent Number: 6,133,770
[45] Date of Patent: Oct. 17, 2000

[54] PHASE LOCKED LOOP CIRCUIT

[75] Inventor: Atsushi Hasegawa, Tokyo, Japan

[73] Assignee: NEC Corporation, Tokyo, Japan

[21] Appl. No.: 09/203,179

[22] Filed: Nov. 30, 1998

[30] Foreign Application Priority Data

Nov. 28, 1997 [JP] Japan .................................. 9-328573

[51] Int. Cl.$^7$ ...................................................... H03L 7/06
[52] U.S. Cl. ........................ 327/156; 327/157; 327/159; 327/160; 327/161
[58] Field of Search ..................................... 327/156, 157, 327/158, 159, 160, 161; 331/1 A, 10, 11, 12, 13, 14, 17

[56] References Cited

U.S. PATENT DOCUMENTS

| | | | |
|---|---|---|---|
| 4,933,959 | 6/1990 | Knechtel | 375/120 |
| 5,382,922 | 1/1995 | Gersbach et al. | 331/1 A |
| 5,648,744 | 7/1997 | Prakash et al. | 331/11 |
| 5,696,468 | 12/1997 | Nise | 331/14 |

FOREIGN PATENT DOCUMENTS

| | | |
|---|---|---|
| 61-144125 | 7/1986 | Japan . |
| 62-39916 | 2/1987 | Japan . |
| 62-73640 | 5/1987 | Japan . |
| 62-230224 | 10/1987 | Japan . |
| 63-22918 | 9/1988 | Japan . |
| 4-37219 | 2/1992 | Japan . |
| 4-70122 | 3/1992 | Japan . |
| 4-241520 | 8/1992 | Japan . |
| 4-343524 | 11/1992 | Japan . |
| WO 93/03545 | 2/1993 | Japan . |
| 5-327488 | 12/1993 | Japan . |
| 7-131337 | 5/1995 | Japan . |
| 8-307257 | 11/1996 | Japan . |
| 61-13815 | 1/2000 | Japan . |

*Primary Examiner*—Toan Tran
*Assistant Examiner*—Paul Dinh
*Attorney, Agent, or Firm*—McGinn & Gibb, P.C.

[57] ABSTRACT

A phase locked loop circuit comprises a voltage controlled oscillator generating an output signal having the frequency controlled by an applied control voltage, a comparing circuit for comparing an input signal with the output signal of the voltage controlled oscillator in phase or in frequency, and a charge pump and loop filter receiving an output signal of the comparing circuit for generating the control voltage applied to the voltage controlled oscillator. A control circuit is additionally provided which receives the output signal of the comparing circuit for controlling, on the basis of a pulse width of the output signal of the comparing circuit, a center frequency of a phase locked loop formed of the voltage controlled oscillator, the comparing circuit and the control voltage outputting circuit. Thus, the PLL circuit constructed of only a simple digital circuit and having an enlarged capture range and a high stability, can be realized.

9 Claims, 5 Drawing Sheets

PHASE LOCKED LOOP CIRCUIT

BACKGROUND OF THE INVENTION

1. Field of the Invention

The present invention relates to a phase locked loop circuit (called a "PLL circuit" in this specification), and more specifically to a phase locked loop circuit having large capture range and a high stability.

2. Description of Related Art

Referring to FIG. 5, there is shown a block diagram of a conventional PLL circuit. The PLL shown circuit includes a phase/frequency comparing circuit (PFD) 3 having one input connected to receive an input signal 1, a charge pump 4 receiving an UP signal 11 and a DOWN signal 12 from the phase/frequency comparing circuit 3, a loop filter (low pass filter, LPF) 5 having an input connected to an output of the charge pump 4, and a voltage controlled oscillator (VCO) 2 having an input connected to an output of the loop filter 5 and an output connected to the other input of the phase/frequency comparing circuit 3.

The phase/frequency comparing circuit 3 compares the input signal 1 with the output signal of the voltage controlled oscillator 2 in phase or in frequency, and outputs the UP signal 11 and the DOWN signal 12 which are a pulse signal having a width corresponding to a phase difference or a frequency difference between the input signal 1 with the output signal of the voltage controlled oscillator 2. The charge pump 4 is configured so that when the UP signal 11 is active, an internal charging switch (not shown) is put in an ON condition so as to charge an internal capacitor (not shown) during an ON period of the internal charging switch, and when the UP signal 11 is inactive, the internal charging switch is put in an OFF condition to maintain the potential of the internal capacitor, and further when the DOWN signal 12 is active, an internal discharging switch (not shown) is put in an ON condition so as to discharge the internal capacitor during an ON period of the internal discharging switch, and when the down signal 12 is inactive, the internal discharging switch is put in an OFF condition to maintain the potential of the internal capacitor. Therefore, the electric charge stored in the internal capacitor of the charge pump 4 is selectively charged, discharged or maintained in accordance with the UP signal 11 and the DOWN signal 12.

The loop filter 5 smoothes the voltage which varies depending upon the charging/discharging of the electric charge stored in the charge pump. In accordance with an output voltage of the loop filter 5, the voltage controlled oscillator 2 controls the frequency of the oscillation of the voltage controlled oscillator 2 so as to make the phase or frequency difference between the input signal 1 and the oscillation signal outputted from the voltage controlled oscillator 2 zero.

In general, when the PLL circuit is used for generating a clock for a system including a digital circuit, a capture range of the PLL circuit is required to be large in order to supply a clock in all possible modes that the system can assume.

For example, Japanese Patent Application Preexamination Publication No. JP-A-04-070122, (an English abstract of JP-A-04-070122 is available from the Japanese Patent Office and the content of the English abstract of JP-A-04-070122 is incorporated by reference in its entirety into this application) discloses one prior art PLL circuit configured to enlarge the capture range of the PLL circuit. Referring to FIG. 6, there is shown a block diagram of this prior art PLL circuit.

In FIG. 6, elements similar to those shown in FIG. 5 are given the same Reference Numerals, and an explanation thereof will be omitted. As shown in FIG. 6, this prior art PLL circuit includes a counter 6 for counting an arbitrary clock CK from a clock circuit 18, a register 24 for latching and holding the value of the counter 6, and a current switch circuit 7 for supplying a current adjusted in accordance with the value held in the register 24, to one input of an analog adder 27, which has the other input connected to the output of the loop filter 5 and an output connected to the input of the voltage controlled oscillator 2. This shown prior art PLL circuit also includes a reset circuit 8 for resetting the counter 6 and the register 24, a reference voltage circuit 20 for generating a first reference voltage $V_{RO}$ and a second reference voltage $V_R$, a comparator 21 for comparing the output voltage of the loop filter 5 with the reference voltage $V_R$ to output a control signal, a timing circuit 22 responding to the control signal from the comparator 21 to control a switch 23 which controls the counter 6 and the register 24.

Now, an operation of the prior art PLL circuit shown in FIG. 6 will be described with reference to FIG. 6 and FIG. 7 which is a timing chart illustrating a relation between an error voltage and control signals in the prior art PLL circuit shown in FIG. 6. Here, the first reference voltage $V_{RO}$ corresponds to a voltage supplied to the voltage controlled oscillator 2 when the voltage controlled oscillator 2 oscillates at an center frequency of the capture range of the PLL circuit, and the second reference voltage $V_R$ is defined as $V_R=(V_{RO}-\Delta V)$ where $\Delta V$ is an offset value. A minimum value of the current supplied from the current switch circuit 7 corresponds to a voltage supplied to the voltage controlled oscillator 2 when the voltage controlled oscillator 2 oscillates at a low frequency out of the capture range of the PLL circuit.

First, when it is powered on, the counter 6 and the register 24 are reset by a reset signal RESET from the reset circuit 8. After the counter 6 is reset, the counter 6 starts to count up the clock CK from the clock circuit 18, and the count value of the counter 6 is latched by the register 24 at each clock, so that the current switch circuit 7 supplies a current in proportion to the count value of the counter 6. Namely, the current outputted from the current switch circuit 7 gradually increases in proportion to the count value of the counter 6. In accordance with the increasing current, the free-running frequency of the voltage controlled oscillator 2 gradually elevates from the low frequency out of the capture range of the PLL circuit, so that the oscillating frequency ultimately comes within the capture range of the PLL circuit, and the PLL circuit is put in a locked condition.

On the other hand, as shown in FIG. 7, the phase/frequency comparing circuit 3 outputs an error signal corresponding to the first reference voltage $V_{RO}$ when the frequency of the output signal of the voltage controlled oscillator 2 is out of the capture range of the PLL circuit, and outputs the error signal corresponding to the frequency difference between the input signal 1 and the output signal of the voltage controlled oscillator 2 when the frequency of the output signal of the voltage controlled oscillator 2 comes within the capture range of the PLL circuit. Therefore, at this time, the phase/frequency comparing circuit 3 starts to output the error signal lower than the second reference voltage $V_R$, and the comparator 21 outputs the control signal of a low level.

After the PLL circuit is put in the locked condition, if the current outputted from the current switch circuit 7 increases, the error voltage outputted from the phase/frequency comparing circuit 3 increases as shown in FIG. 7. When the output of the loop filter 5 reaches the second reference voltage $V_R$, the output of the comparator 21 is brought to a high level, which brings the output of the timing circuit 22 into a low level, which controls the switch 23 to the effect that the register 24 no longer latches a new count value of the counter 6 and the output current of the current switch circuit 7 is fixed to the value designated by the content held in the register 24. Thereafter, only the control loop of the PLL circuit operates.

In the above mentioned prior art PLL circuit, the free-running frequency of the voltage controlled oscillator 2 is forcibly changed from the low frequency out of the capture range of the PLL circuit, and when the free-running frequency of the voltage controlled oscillator 2 comes within the capture range of the PLL circuit, the PLL circuit is controlled by detecting the change of the error voltage. Therefore, the capture range can be substantially enlarged.

However, since the above mentioned prior art PLL circuit requires the reference voltage circuit 20 and the comparator 21, the circuit scale becomes large. In addition, since the above mentioned prior art PLL circuit is sensitive to the temperature variation and to the power supply voltage variation, the capture range cannot be enlarged because it is necessary to compensate for the sensitivity problem, and therefore, it is difficult to improve the jitter amount.

SUMMARY OF THE INVENTION

Accordingly, it is an object of the present invention to provide a PLL circuit which overcomes the above mentioned problems of the prior art.

Another object of the present invention is to provide a PLL circuit which can be constructed of a simple digital circuit and which has an enlarged capture range and high stability.

The above and other objects of the present invention are achieved in accordance with the present invention by a phase locked loop circuit comprising a voltage controlled oscillator generating an output signal having the frequency controlled by an applied control voltage, a comparing circuit for comparing an input signal with the output signal of the voltage controlled oscillator in phase or in frequency, a control voltage outputting circuit receiving an output signal of the comparing circuit for generating the control voltage applied to the voltage controlled oscillator, and means receiving the output signal of the comparing circuit for controlling, on the basis of a pulse width of the output signal of the comparing circuit, a center frequency of a phase locked loop formed of the voltage controlled oscillator, the comparing circuit and the control voltage outputting circuit.

According to another aspect of the present invention, there is provided a phase locked loop circuit comprising a voltage controlled oscillator generating an output signal having the frequency controlled by an applied control voltage, a comparing circuit for comparing an input signal with the output signal of the voltage controlled oscillator in phase or in frequency, a control voltage outputting circuit receiving an output signal of the comparing circuit for generating the control voltage applied to the voltage controlled oscillator, a counter for counting a clock signal, a first means receiving a count value of the counter for controlling, on the basis of the count value of the counter, a center frequency of a phase locked loop formed of the voltage controlled oscillator, the comparing circuit and the control voltage outputting circuit, a delay circuit receiving the output signal of the comparing circuit, and a second means receiving the output signal of the comparing circuit and an output signal of the delay circuit for controlling a counting operation of the counter on the basis of a logic AND in a pulse width between the output signal of the comparing circuit and the output signal of the delay circuit.

In one embodiment, the control voltage outputting circuit includes a charge pump receiving the output signal of the comparing circuit for selectively charging or discharging an electric charge, and a loop filter receiving and smoothing an output of the charge pump to output the control voltage applied to the voltage controlled oscillator. The first means includes a current switch circuit receiving the count value of the counter for supplying a current corresponding to the count value of the counter, additionally to the voltage controlled oscillator, thereby controlling, on the basis of the count value of the counter, the center frequency of the phase locked loop formed of the voltage controlled oscillator, the comparing circuit and the control voltage outputting circuit.

In this phase locked loop circuit, the counter can receive the output signal of the voltage controlled oscillator as the clock signal.

According to still another aspect of the present invention, there is provided a phase locked loop circuit comprising:

a voltage controlled oscillator generating an output signal having the frequency controlled by an applied control voltage;

a comparing circuit for comparing an input signal with the output signal of the voltage controlled oscillator in phase or in frequency, the comparing circuit outputting an UP signal when the input signal is advanced in phase in comparison with the output signal of the voltage controlled oscillator or the input signal is higher in frequency than the output signal of the voltage controlled oscillator, the comparing circuit outputting a DOWN signal when the input signal is delayed in phase in comparison with the output signal of the voltage controlled oscillator or the input signal is lower in frequency than the output signal of the voltage controlled oscillator;

a charge pump receiving the UP signal and the DOWN signal of the comparing circuit for selectively charging or discharging an electric charge;

a loop filter receiving and smoothing an output of the charge pump to output the control voltage applied to the voltage controlled oscillator;

a counter for counting a clock signal;

a current switch circuit receiving the count value of the counter for supplying a current corresponding to the count value of the counter, additionally to the voltage controlled oscillator, thereby controlling, on the basis of the count value of the counter, the center frequency of a phase locked loop formed of the voltage controlled oscillator;

a first delay circuit receiving the UP signal;

a second delay circuit receiving the DOWN signal;

a first AND gate receiving the UP signal and an output of the first delay circuit for outputting an UP enable signal which is a first logic AND in a pulse width between the UP signal and an output of the first delay circuit;

a second AND gate receiving the DOWN signal and an output of the second delay circuit for outputting a DOWN enable signal which is a second logic AND in a pulse width between the DOWN signal and an output of the second delay circuit; and an OR gate receiving the UP enable signal and the DOWN enable signal for outputting to the counter a counter enable signal which is a logic OR between the UP enable signal and the DOWN enable signal.

In a preferred embodiment, the phase locked loop circuit further includes a means receiving the UP signal and the DOWN signal for outputting to the counter an UP/DOWN signal determining which of the count-up and the count-down, the counter is.

In this phase locked loop circuit, the counter can receive the output signal of the voltage controlled oscillator as the clock signal.

As mentioned above, in the phase locked loop circuit in accordance with the present invention, since the center frequency of the phase locked loop composed of the phase/frequency comparing circuit, the control voltage outputting circuit (the charge pump and the loop filter) and the voltage controlled oscillator can be freely shifted by the pulse width of the phase/frequency comparing circuit, it is possible to realize the PLL circuit constructed of only a simple digital circuit and having an enlarged capture range and a high stability.

The above and other objects, features and advantages of the present invention will be apparent from the following description of preferred embodiments of the invention with reference to the accompanying drawings.

DESCRIPTION OF THE PREFERRED EMBODIMENTS

Figure 1:
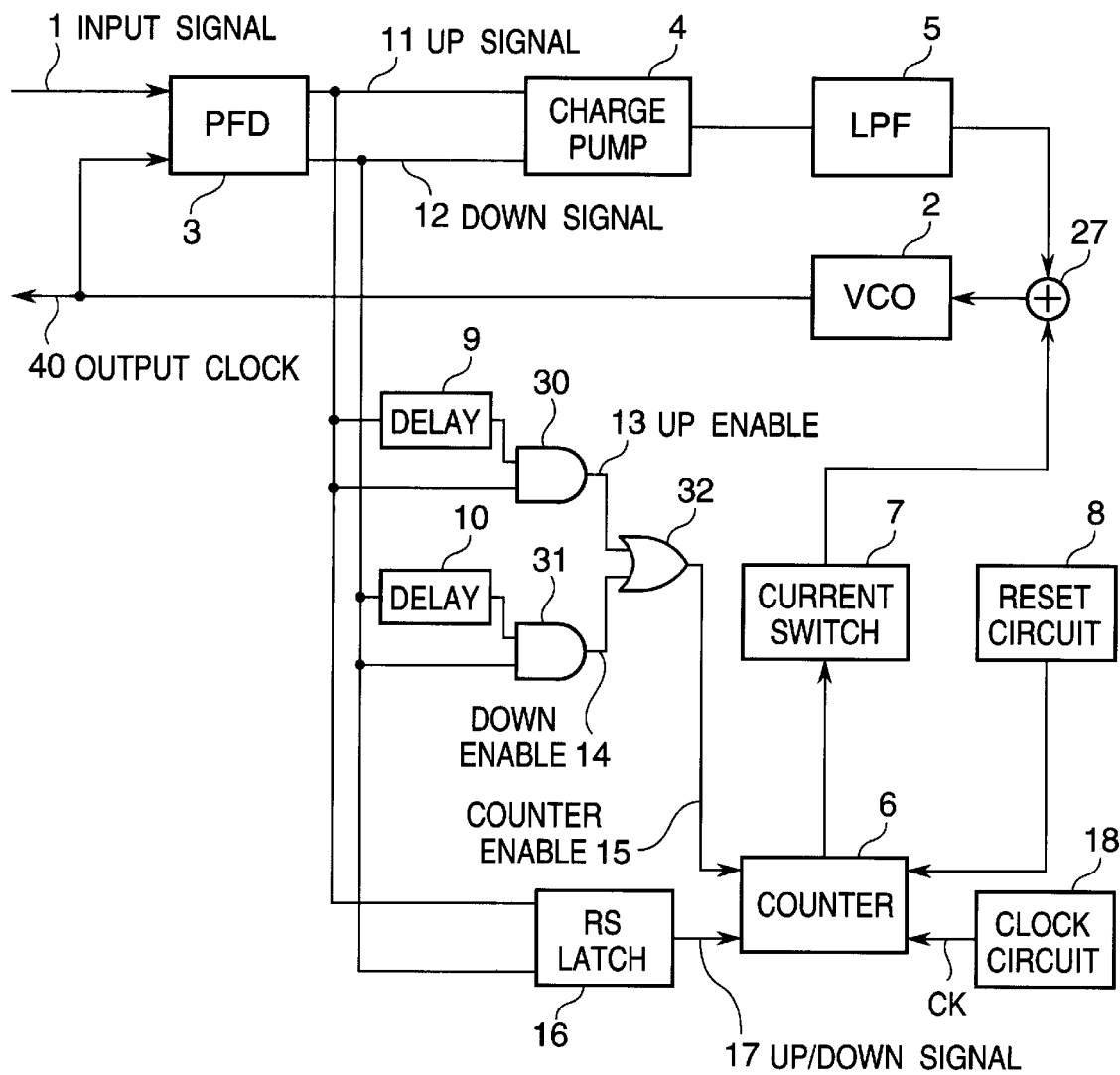
FIG. 1 is a block diagram of a first embodiment of the PLL circuit in accordance, with the present invention.

Referring to FIG. 1, there is shown a block diagram of a first embodiment of the PLL circuit in accordance with the present invention. In FIG. 1, elements similar to those shown in FIGS. 5 and 6 are given the same Reference Numerals.

Figure 5:
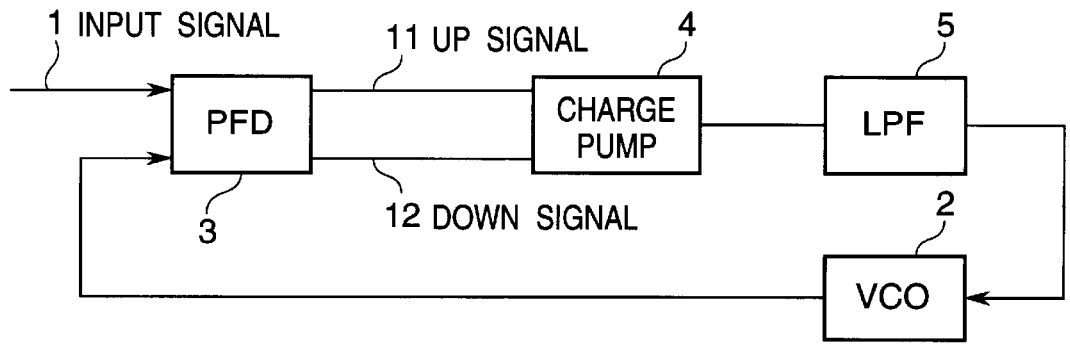
FIG. 5 is a block diagram of a conventional PLL circuit.
Figure 6:
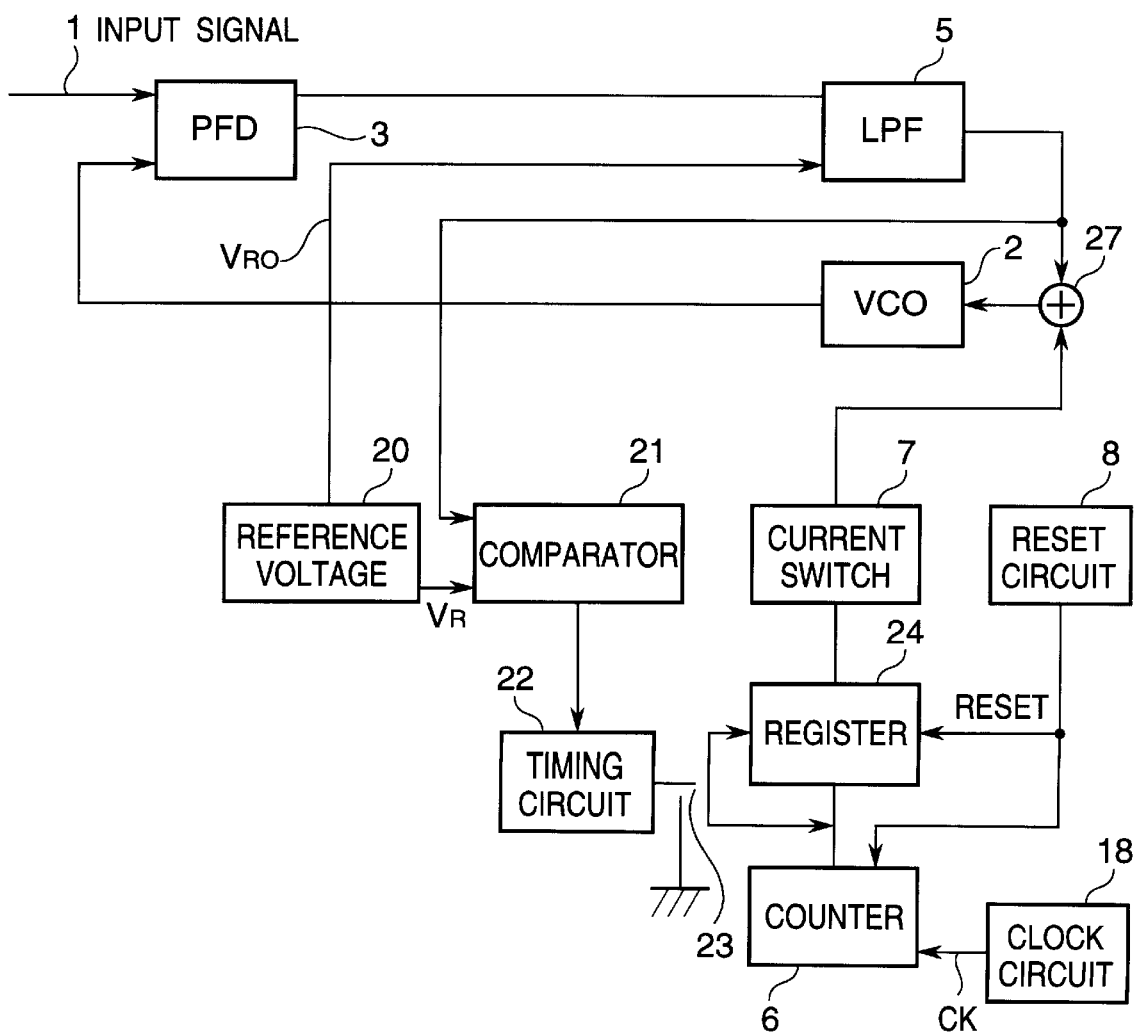
FIG. 6 is a block diagram of another prior art PLL circuit.
Figure 7:
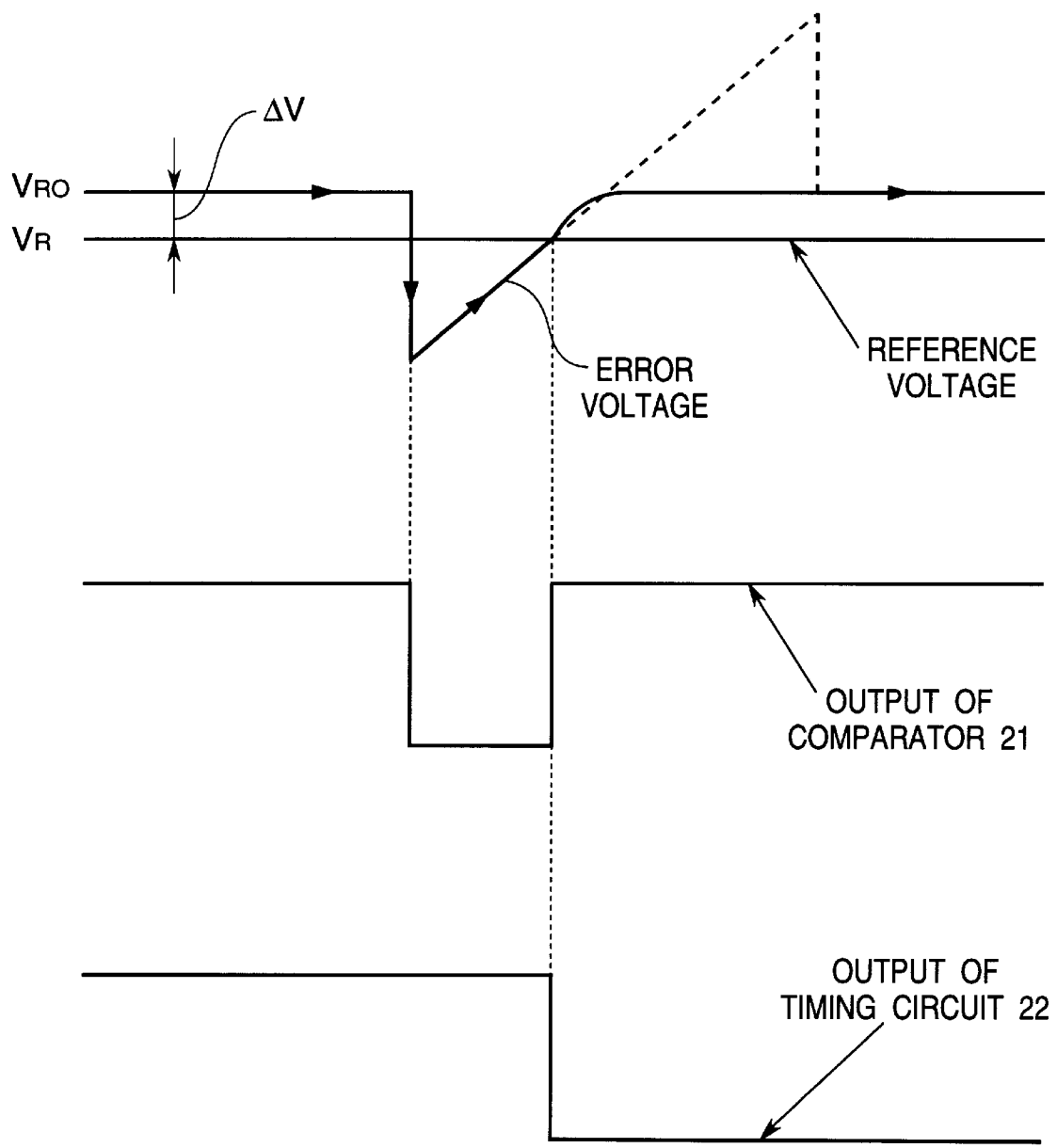
FIG. 7 is timing chart illustrating a relation between an error voltage and control signals in the prior art PLL circuit shown in FIG. 6.

The shown embodiment includes the voltage controlled oscillator (VCO) 2, the phase/frequency comparing circuit (PFD) 3, the charge pump 4, the loop filter (low pass filter, LPF) 5, the counter 6, the current switch circuit 7, the reset circuit 8, the clock circuit 18 and the analog adder 27, similarly to those shown in FIGS. 5 and 6. The shown embodiment further includes a delay circuit 9 receiving the UP signal 11, another delay circuit receiving the DOWN signal 12, an AND gate 30 receiving an output of the delay circuit 9 and the UP signal 11, another AND gate 31 receiving an output of the delay circuit 10 and the DOWN signal 12, an OR gate 32 receiving an output of each of the AND gates 30 and 31, and a RS latch (reset-set flipflop) 16 having a set input connected to receive one of the UP signal 11 and the DOWN signal 12 and a reset input connected to receive the other of the UP signal 11 and the DOWN signal 12. The counter 6 is reset by the reset circuit 8 to start to count up the clock CK from the clock circuit 18, and is controlled by an output of the OR gate 32 and an output of the RS latch 16. The current switch circuit 7 is directly controlled by the count value of the counter 6. This counter 6 is an up/down counter.

Now, an operation of the first embodiment will be described.

When it is powered on, or when the system is reset, the counter 6 is set by the reset circuit to the condition that only the most significant bit of the counter is "1" and the other bits of the counter are "0". Then, the counter 6 starts to count up the clock CK from the clock circuit 18.

Figure 2:
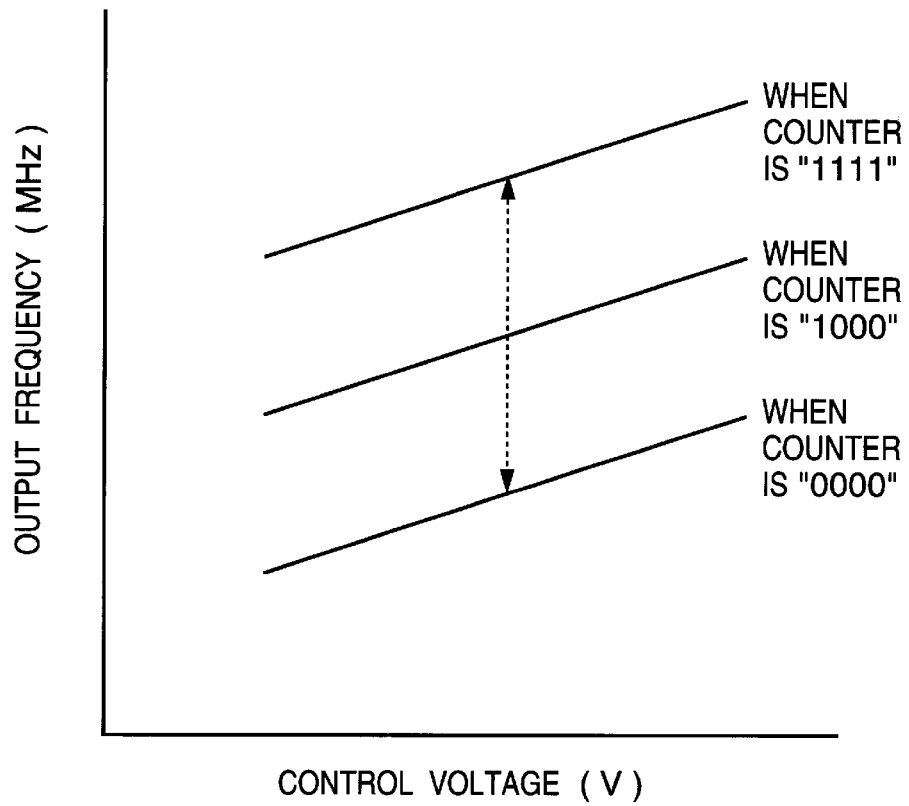
FIG. 2 is a graph illustrating a control voltage of the voltage controlled oscillator and an output frequency in the PLL circuit in accordance with the present invention.

The current switch circuit 7 outputs the current corresponding to the value of the counter 6, through the analog adder 27 to the voltage controlled oscillator 2. The output frequency of the voltage controlled oscillator 2 changes as shown in FIG. 2, which is a graph illustrating the control voltage of the voltage controlled oscillator 2 and an output frequency. After the resetting, on the other hand, the phase/frequency comparing circuit 3 compares the input signal 1 with the output signal of the voltage controlled oscillator 2 having the frequency determined by the current switch circuit 7. If the input signal 1 is advanced in phase in comparison with the output signal of the voltage controlled oscillator 2, or if the input signal 1 is higher in frequency than the output signal of the voltage controlled oscillator 2, the phase/frequency comparing circuit 3 outputs the active UP signal 11. If the input signal 1 is delayed in phase in comparison with the output signal of the voltage controlled oscillator 2, or if the input signal 1 is lower in frequency than the output signal of the voltage controlled oscillator 2, the phase/frequency comparing circuit 3 outputs the active DOWN signal 12.

Each of the active UP signal 11 and the active DOWN signal 12 is in the form of a pulse signal having the pulse width corresponding to the phase difference or the frequency difference. The active UP signal 11 is supplied to the delay circuit 9 and the AND gate 30, and the AND circuit 30 executes a logical AND operation of the UP signal 11 and the output of the delay circuit 9, so that the AND circuit 30 outputs an UP enable signal 13 when the pulse width of the UP signal 11 is longer than the delay time of the delay circuit 9, as shown in FIG. 3.

Figure 3:
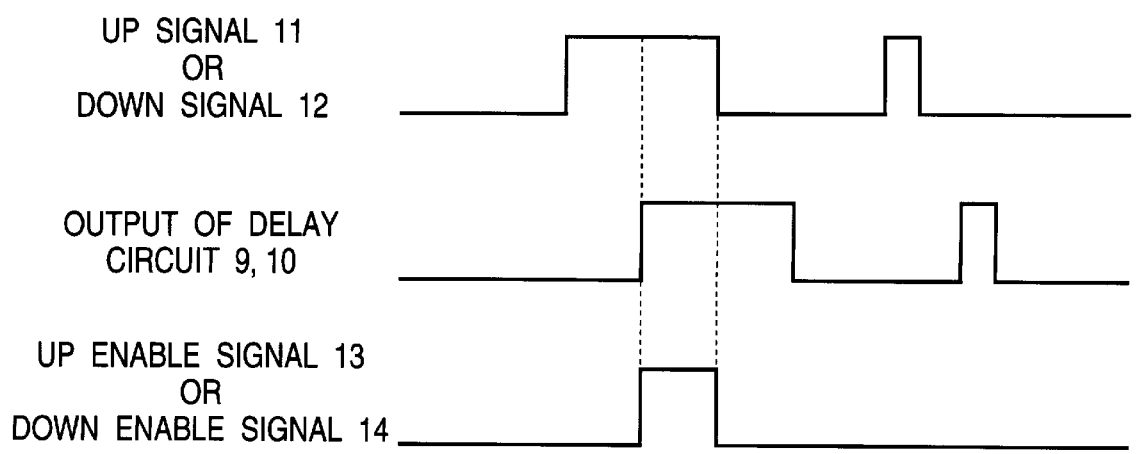
FIG. 3 is a timing chart illustrating an operation of the PLL circuit in accordance with the present invention.

Furthermore, the active DOWN signal 12 is supplied to the delay circuit 10 and the AND gate 31, and the AND circuit 31 executes a logical AND operation of the DOWN signal 12 and the output of the delay circuit 10, so that the AND circuit 31 outputs a DOWN enable signal 14 when the pulse width of the DOWN signal 12 is longer than the delay time of the delay circuit 10, as shown in FIG. 3.

The delay time of the delay circuits 9 and 10 is arbitrarily set on the basis of an incrementing step width of the free-running frequency of the voltage controlled oscillator 2 controlled by the current switch circuit 7. In addition, the UP enable signal 13 and the DOWN enable signal 14 are supplied to the OR gate 32, which outputs a counter enable signal 15 to the counter 6. During a period in which the counter enable signal 15 is active, the counter 6 is maintained in an active condition continuing its counting operation. On the other hand, since the RS latch 16 is set or reset by the UP signal 11 or the DOWN signal 12, the RS latch 16 generates an UP/DOWN signal 17 which determines the count-up and the count-down of the counter 6. For example, when the RS latch 16 is set by the UP signal 11, the UP/DOWN signal 17 indicates the count-up of the counter 6, and when the RS latch 16 is reset by the DOWN signal 12, the UP/DOWN signal 17 indicates the count-down of the counter 6. Thus, the time width of the enable signal 15 is determined by the magnitude of the frequency difference or the phase difference between the input signal 1 and the output signal of the voltage controlled oscillator 2, so that the number of the clocks CK counted by the counter 6 changes in accordance with the magnitude of the frequency difference or the phase difference between the input signal 1 and the output signal of the voltage controlled oscillator 2. Namely, when the frequency difference or the phase difference is large, the number of the clocks CK counted by the counter 6 becomes large, so that the count value of the counter 6 rapidly changes, and therefore, the changing amount of the current supplied from the current switch circuit 7 becomes large. To the contrary, when the frequency difference or the phase difference is small, the number of the clocks CK counted by the counter 6 becomes small, so that the count value of the counter 6 slowly changes, and therefore, the changing amount of the current supplied from the current switch circuit 7 becomes small.

Thus, the free-running frequency of the voltage controlled oscillator 2 is dynamically controlled by the frequency difference or the phase difference between the input signal 1 and the output signal of the voltage controlled oscillator 2. This control of the voltage controlled oscillator 2 through the current switch circuit 7 is added to the control loop composed of the phase/frequency comparing circuit 3, the charge pump 4, the loop filter 5 and the voltage controlled oscillator 2. However, when the frequency difference or the phase difference (namely, the pulse width of the active UP signal 11 or the active DOWN signal 12) is smaller than the delay time of the delay circuits 9 and 10 as shown in a right half of FIG. 3, the counter enable signal 15 is not activated, with the result that only the control loop composed of the phase/frequency comparing circuit 3, the charge pump 4, the loop filter 5 and the voltage controlled oscillator 2 operates.

On the other hand, when the count value of the counter 6 reaches a maximum value (for example, "1111"), since the maximum current (namely, maximum voltage) is supplied to the analog switch 27, the output frequency of the voltage controlled oscillator 2 changes in a high frequency region in response to the control voltage outputted from the loop filter 5, as shown in FIG. 2. When the count value of the counter 6 reaches a minimum value (for example, "0000"), since the minimum current (namely, minimum voltage) is supplied to the analog switch 27, the output frequency of the voltage controlled oscillator 2 changes in a low frequency region in response to the control voltage outputted from the loop filter 5, as shown in FIG. 2. In other words, the center frequency of the capture range of the control loop composed of the phase/frequency comparing circuit 3, the charge pump 4, the loop filter 5 and the voltage controlled oscillator 2 can be freely shifted by the current supplied from the current switch circuit 7.

Accordingly, the first embodiment of the PLL circuit in accordance with the present invention can stably operate with a substantially enlarged capture range and with a simple construction.

Figure 4:
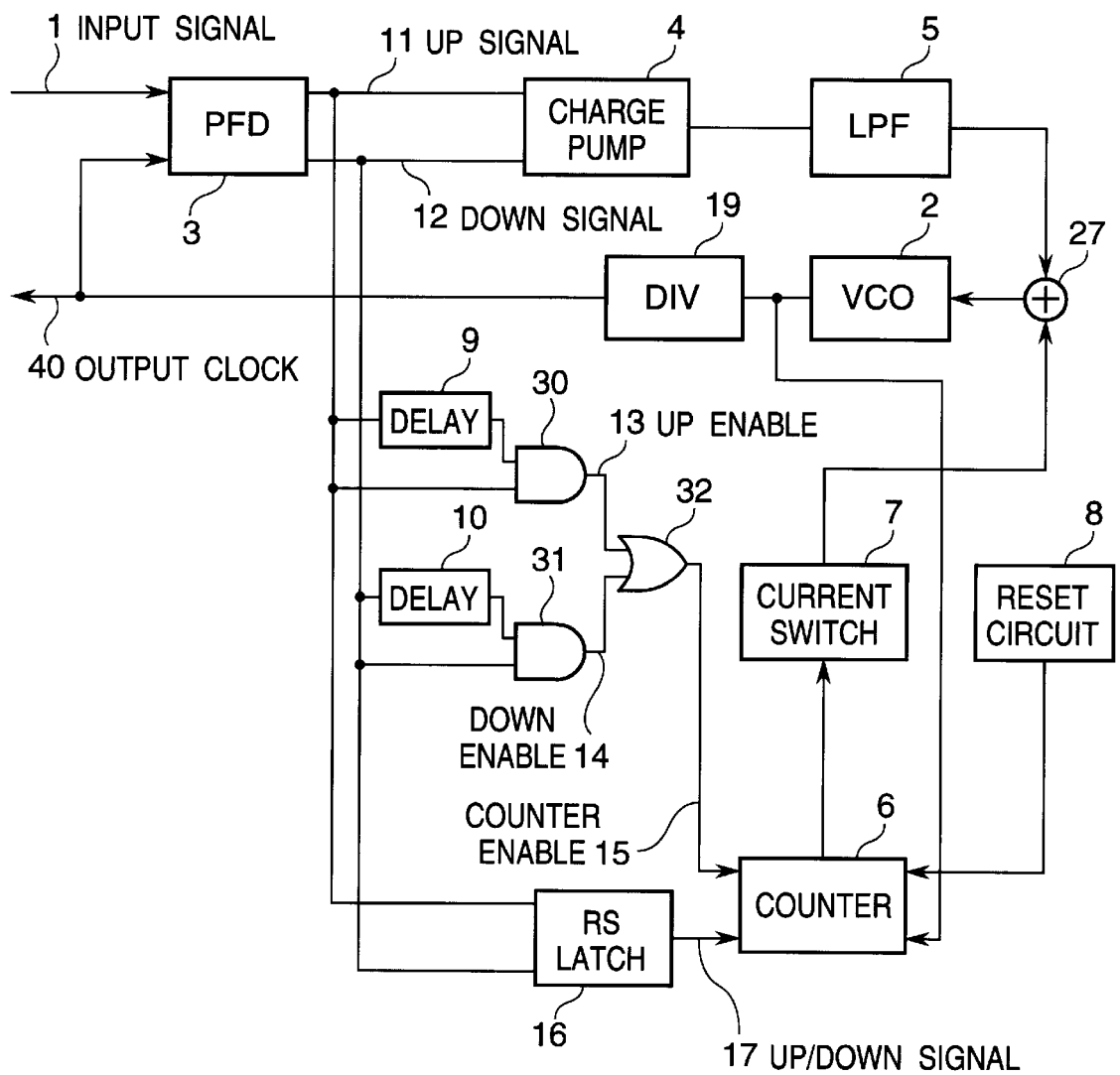
FIG. 4 is a block diagram of a second embodiment of the PLL circuit in accordance with the present invention.

Referring to FIG. 4, there is shown a block diagram of a second embodiment of the PLL circuit in accordance with the present invention. In FIG. 4, elements similar to those shown in FIG. 1 are given the same Reference Numerals, and explanation thereof will be omitted for simplification of description.

As seen from comparison between FIG. 1 and FIG. 4, the second embodiment is featured in that a frequency divider 19 is inserted between the voltage controlled oscillator 2 and the phase/frequency comparing circuit 3, so that the frequency of the output signal of the voltage controlled oscillator 2 is brought down to a frequency divided by a frequency dividing ratio set in the frequency divider 19. In addition, the delay time of the delay circuits 9 and 10 are arbitrarily set by taking the frequency dividing ratio of the frequency divider 19 into consideration. The reason for this is that: Since the frequency of the output signal of the voltage controlled oscillator changes depending upon the frequency dividing ratio of the frequency divider 19, if the delay time is not adjusted, the relation between the time length of the count enable signal 15 and the count-up number or the count-down number of the counter 6 changes.

For example, the delay time of the delay circuits 9 and 10 is set to be equal to one period of an expected output clock 40, so that when the pulse width of the UP or DOWN signal is longer than the set delay time, the counter 6 is counted up or down, to change the free-running frequency of the voltage controlled oscillator 2 by the current from the current switch circuit 7, and when the pulse width of the UP or DOWN signal is shorter than the set delay time, the counting-up or counting-down of the counter 6 is stopped and only the inherent loop of the PLL circuit operates Furthermore, as seen from comparison between FIG. 1 and FIG. 4, the second embodiment is featured in that the clock circuit 18 is omitted, and the output signal of the voltage controlled oscillator 2 is supplied to the counter 6. Therefore, an external clock is no longer necessary.

Excepting for the above mentioned two features, since the second embodiment is the same as the first embodiment, a fundamental operation of the second embodiment is the same as that of the first embodiment, and therefore, an advantage similar to that obtained in the first embodiment can be obtained in the second embodiment.

As seen from the above, in the PLL circuit in accordance with the present invention, since the center frequency of the phase locked loop composed of the phase/frequency comparing circuit 3, the charge pump 4, the loop filter 5 and the voltage controlled oscillator 2 can be freely shifted by the pulse width of the phase/frequency comparing circuit, it is possible to realize the PLL circuit constructed of only a simple digital circuit and having an enlarged capture range and a high stability.

The invention has thus been shown and described with reference to the specific embodiments. However, it should be noted that the present invention is in no way limited to the details of the illustrated structures but changes and modifications may be made within the scope of the appended claims.

What is claimed is:

1. A phase locked loop circuit comprising:
   a voltage controlled oscillator generating an output signal having the frequency controlled by an applied control voltage;
   a comparing circuit for comparing an input signal with said output signal of said voltage controlled oscillator in phase or in frequency;
   a control voltage outputting circuit receiving an output signal of said comparing circuit for generating said control voltage applied to said voltage controlled oscillator; and
   means receiving said output signal of said comparing circuit for controlling, on the basis of a pulse width of said output signal of said comparing circuit, a center frequency of a phase locked loop formed of said voltage controlled oscillator, said comparing circuit and said control voltage outputting circuit, said means outputting a control signal on the basis of said pulse width to said phase locked loop, wherein said means comprises a delay circuit receiving said output signal of said comparing circuit.

2. A phase locked loop circuit comprising:

a voltage controlled oscillator generating an output signal having the frequency controlled by an applied control voltage;

a comparing circuit for comparing an input signal with said output signal of said voltage controlled oscillator in phase or in frequency;

a control voltage outputting circuit receiving an output signal of said comparing circuit for generating said control voltage applied to said voltage controlled oscillator, a counter for counting a clock signal;

a first means receiving a count value of said counter for controlling, on the basis of said count value of said counter, a center frequency of a phase locked loop formed of said voltage controlled oscillator, said comparing circuit and said control voltage outputting circuit, said first means outputting a control signal on the basis of a pulse width to said phase locked loop;

a delay circuit receiving said output signal of said comparing circuit; and a second means receiving said output signal of said comparing circuit and an output signal of said delay circuit for controlling a counting operation of said counter on the basis of a logic AND in a pulse width between said output signal of said comparing circuit and said output signal of said delay circuit.

3. The phase locked loop circuit claimed in claim 2, wherein said control voltage outputting circuit includes a charge pump receiving said output signal of said comparing circuit for selectively charging or discharging an electric charge, and a loop filter receiving and smoothing an output of said charge pump to output said control voltage applied to said voltage controlled oscillator, and wherein said first means includes a current switch circuit receiving said count value of said counter for supplying a current corresponding to said count value of said counter, additionally to said voltage controlled oscillator, thereby controlling, on the basis of said count value of said counter, said center frequency of said phase locked loop formed of said voltage controlled oscillator, said comparing circuit and said control voltage outputting circuit.

4. The phase locked loop circuit claimed in claim 3, wherein said counter receives said output signal of said voltage controlled oscillator as said clock signal.

5. The phase locked loop circuit claimed in claim 2, wherein said counter receives said output signal of said voltage controlled oscillator as said clock signal.

6. A phase locked loop circuit comprising:

a voltage controlled oscillator generating an output signal having the frequency controlled by an applied control voltage;

a comparing circuit for comparing an input signal with said output signal of said voltage controlled oscillator in phase or in frequency, said comparing circuit outputting an UP signal when said input signal is advanced in phase in comparison with said output signal of said voltage controlled oscillator or said input signal is higher in frequency than said output signal of said voltage controlled oscillator, said comparing circuit outputting a DOWN signal when said input signal is delayed in phase in comparison with said output signal of said voltage controlled oscillator or said input signal is lower in frequency than said output signal of said voltage controlled oscillator;

a charge pump receiving said UP signal and said DOWN signal of said comparing circuit for selectively charging or discharging an electric charge;

a loop filter receiving and smoothing an output of said charge pump to output said control voltage applied to said voltage controlled oscillator;

a counter for counting a clock signal;

a current switch circuit receiving said count value of said counter for supplying a current corresponding to said count value of said counter, additionally to said voltage controlled oscillator, thereby controlling, on the basis of said count value of said counter, said center frequency of a phase locked loop formed of said voltage controlled oscillator;

a first delay circuit receiving said UP signal;

a second delay circuit receiving said DOWN signal;

a first AND gate receiving said UP signal and an output of said first delay circuit for outputting an UP enable signal which is a first logic AND in a pulse width between said UP signal and an output of said first delay circuit;

a second AND gate receiving said DOWN signal and an output of said second delay circuit for outputting a DOWN enable signal which is a second logic AND in a pulse width between said DOWN signal and an output of said second delay circuit; and an OR gate receiving said UP enable signal and said DOWN enable signal for outputting to said counter a counter enable signal which is a logic OR between said UP enable signal and said DOWN enable signal.

7. A phase locked loop circuit claimed in claim 6 further including a means receiving said UP signal and said DOWN signal for outputting to said counter an UP/DOWN signal determining in which of the count-up and the count-down, said counter is.

8. A phase locked loop circuit claimed in claim 7 wherein said counter receives said output signal of said voltage controlled oscillator as said clock signal.

9. A phase locked loop circuit claimed in claim 6 wherein said counter receives said output signal of said voltage controlled oscillator as said clock signal.

* * * * *